US012801498B2

(12) United States Patent
Chen

(10) Patent No.: US 12,801,498 B2
(45) Date of Patent: Nov. 17, 2026

(54) SERVER SYSTEM AND CIRCUIT VERIFICATION METHOD

(71) Applicant: MITAC COMPUTING TECHNOLOGY CORPORATION, Taoyuan City (TW)

(72) Inventor: Yu-Yu Chen, Taoyuan City (TW)

(73) Assignee: MITAC COMPUTING TECHNOLOGY CORPORATION, Taoyuan City (TW)

( * ) Notice: Subject to any disclaimer, the term of this patent is extended or adjusted under 35 U.S.C. 154(b) by 25 days.

(21) Appl. No.: 18/999,950

(22) Filed: Dec. 23, 2024

(65) Prior Publication Data

US 2025/0390392 A1 Dec. 25, 2025

(30) Foreign Application Priority Data

Jun. 19, 2024 (TW) ................................ 113122760

(51) Int. Cl.
*G06F 11/14* (2026.01)
*G06F 9/44* (2018.01)
*H05K 7/14* (2006.01)

(52) U.S. Cl.
CPC ............ *G06F 11/1417* (2013.01); *G06F 9/44* (2013.01); *H05K 7/1498* (2013.01); *G06F 2201/805* (2013.01)

(58) Field of Classification Search
CPC .. G06F 11/1417; G06F 9/44; G06F 2201/805; H05K 7/1498
USPC ............................................................ 714/3
See application file for complete search history.

(56) References Cited

U.S. PATENT DOCUMENTS

2005/0213380 A1* 9/2005 Taniguchi ............. G06F 1/3287 365/185.11
2025/0045401 A1* 2/2025 Pennell ................. G06F 21/602
2025/0130965 A1* 4/2025 Gu .......................... G06F 13/36

OTHER PUBLICATIONS

BMC Documentation: "Overview of BMC product software authorization", retrieved from: https://docs.bmccom/xwiki/bin/view/Mainframe/Storage/BMC-AMI-Storage-IAM/bamiiam111/Getting-started/BMC-AMI-Storage-IAM-Overview/BMC-Product-Software-Authorization/Overview-of-BMC-product-software-authorization (Year: 2026).*

(Continued)

*Primary Examiner* — Yair Leibovich
(74) *Attorney, Agent, or Firm* — RABIN & BERDO, P.C.

(57) ABSTRACT

A server system includes a management circuit and a processing circuit. The management circuit includes a first control circuit, a second control circuit and a first memory. The first control circuit includes a storage unit and firmware. The storage unit is configured to store a first list. The firmware includes a plurality of daemons. The second control circuit is coupled to the first control circuit. The first memory is coupled to the first control circuit. The first memory is configured to store a first verification value. The processing circuit is coupled to the management circuit. The processing circuit includes a second memory and a power control circuit. The second memory is coupled to the first control circuit. The second memory is configured to store a second verification value and processing circuit identification information. The power control circuit is coupled to the second control circuit and a power supply.

17 Claims, 5 Drawing Sheets

(56) References Cited

OTHER PUBLICATIONS

BMC Documentation: "Statements in a Dasd Manager Plus job", retrieved from: https://docs.bmccom/xwiki/bin/view/Mainframe/Data-for-Db2/DASD-MANAGER-PLUS-for-DB2/ASU12100/Command-and-syntax-reference/DASD-MANAGER-PLUS-jobs/Statements-in-a-DASD-MANAGER-PLUS-job/ (Year: 2026).*

* cited by examiner

SERVER SYSTEM AND CIRCUIT VERIFICATION METHOD

CROSS-REFERENCE TO RELATED APPLICATION

This non-provisional application claims priority under 35 U.S.C. § 119(a) to Patent Application No. 113122760 filed in Taiwan, R.O.C. on Jun. 19, 2024, the entire contents of which are hereby incorporated by reference.

BACKGROUND

Technical Field

The present invention relates to a security technology, in particular relates to a server system and circuit verification method with circuit compatibility verification and boot verification time acceleration capabilities.

Related Art

In conventional servers, there is a certain degree of interdependency between the server's management board and system board. The BIOS (Basic Input/Output System) firmware and BMC (Baseboard Management Controller) firmware on the server's management board are typically developed specifically for the hardware included in the server's system board.

However, currently there is no verification method available to verify the compatibility between the server's management board and system board. This leads to a situation where, when a server simultaneously contains incompatible system and management boards, issues cannot be detected promptly after power-on and boot-up. Instead, issues are only discovered after the server encounters errors or crashes, or even after components are damaged due to incompatibility. Only after thorough analysis by maintenance personnel to trace the cause of the error is it discovered that the issue or damage was due to pairing the server's system board with an incompatible management board, leading to software and hardware issues.

SUMMARY

In some embodiments, a server system comprises a management circuit and a processing circuit. The management circuit comprises a first control circuit, a second control circuit and a first memory. The first control circuit comprises a storage unit and firmware. The storage unit is configured to store a first list. The firmware comprises a plurality of daemons. The second control circuit is coupled to the first control circuit. The first memory is coupled to the first control circuit. The first memory is configured to store a first verification value. The processing circuit is coupled to the management circuit. The processing circuit comprises a second memory and a power control circuit. The second memory is coupled to the first control circuit. The second memory is configured to store a second verification value and processing circuit identification information. The power control circuit is coupled to the second control circuit and a power supply. The first control circuit is configured to compare the first verification value and the second verification value to verify the processing circuit. When the processing circuit passes verification, the first control circuit provides a first signal to the second control circuit. The second control circuit provides a startup signal to the power control circuit based on the first signal. The power control circuit controls the power supply to supply power to the processing circuit based on the startup signal to start the processing circuit. When the processing circuit starts normally and all the daemons operate normally after the processing circuit starts, the first control circuit stores the processing circuit identification information in the first list.

In some embodiments, the storage unit is further configured to store a second list. When the processing circuit fails the verification, the first control circuit provides a second signal to the second control circuit. The second control circuit provides a startup rejection signal to the power control circuit based on the second signal. The power control circuit controls the power supply not to supply power to the processing circuit based on the startup rejection signal to prevent the processing circuit from starting. When the processing circuit fails the verification, the first control circuit stores the processing circuit identification information in the second list.

In some embodiments, when the processing circuit fails to start normally or when the daemons exhibit abnormal operation after the processing circuit starts, the first control circuit stores the processing circuit identification information in the second list.

In some embodiments, before comparing the first verification value and the second verification value to verify the processing circuit, the first control circuit further checks whether the processing circuit identification information has been stored in the first list or the second list. When the processing circuit identification information has been stored in the first list, the first control circuit provides the first signal to the second control circuit. The second control circuit provides the startup signal to the power control circuit based on the first signal. The power control circuit controls the power supply to supply power to the processing circuit based on the startup signal to start the processing circuit.

In some embodiments, when the processing circuit identification information has been stored in the second list, the first control circuit provides the second signal to the second control circuit. The second control circuit provides the startup rejection signal to the power control circuit based on the second signal. The power control circuit controls the power supply not to supply power to the processing circuit based on the startup rejection signal to prevent the processing circuit from starting.

In some embodiments, when the processing circuit identification information has not been stored in the first list or the second list, the first control circuit compares the first verification value and the second verification value to verify the processing circuit.

In some embodiments, when the processing circuit fails to start normally or the daemons exhibit abnormal operation after the processing circuit starts, the first control circuit executes a recovery procedure. When the processing circuit still fails to start normally or the daemons still exhibit abnormal operation after the first control circuit executes the recovery procedure multiple times, the first control circuit stores the processing circuit identification information in the second list.

In some embodiments, the server system further comprises a display device. When the processing circuit fails the verification, when the processing circuit fails to start normally or when the daemons exhibit abnormal operation after the processing circuit starts, and when the processing circuit identification information has been stored in the second list, the first control circuit displays an error message on the display device.

In some embodiments, a circuit verification method for a server system. The server system comprises a management circuit and a processing circuit. The processing circuit is coupled to the management circuit. The management circuit comprises a first control circuit, a second control circuit, and a first memory. The first control circuit comprises a storage unit and firmware. The second control circuit is coupled to the first control circuit. The processing circuit comprises a second memory and a power control circuit. The second memory is coupled to the first control circuit. The power control circuit is coupled to the second control circuit. The circuit verification method comprises: the first control circuit comparing a first verification value stored in the first memory and a second verification value stored in the second memory to verify the processing circuit; when the processing circuit passes verification, the first control circuit providing a first signal to the second control circuit, the second control circuit providing a startup signal to the power control circuit based on the first signal, and the power control circuit controlling a power supply to supply power to the processing circuit based on the startup signal to start the processing circuit; and when the processing circuit starts normally and all daemons comprised in the firmware operate normally after the processing circuit starts, the first control circuit storing processing circuit identification information stored in the second memory in a first list stored in the storage unit.

In some embodiments, the storage unit is further configured to store a second list. The circuit verification method further comprises: when the processing circuit fails the verification, the first control circuit providing a second signal to the second control circuit, the second control circuit providing a startup rejection signal to the power control circuit based on the second signal, and the power control circuit controlling the power supply not to supply power to the processing circuit based on the startup rejection signal to prevent the processing circuit from starting; and when the processing circuit fails the verification, the first control circuit storing the processing circuit identification information in the second list.

In some embodiments, the circuit verification method further comprises: when the processing circuit fails to start normally or when the daemons exhibit abnormal operation after the processing circuit starts, the first control circuit storing the processing circuit identification information in the second list.

In some embodiments, the circuit verification method further comprises: when the processing circuit fails to start normally or when the daemons exhibit abnormal operation after the processing circuit starts, the first control circuit executing a recovery procedure; and when the processing circuit still fails to start normally or the daemons still exhibit abnormal operation after the first control circuit executes the recovery procedure multiple times, the first control circuit storing the processing circuit identification information in the second list.

In some embodiments, the server system further comprises a display device. The circuit verification method further comprises: when the processing circuit fails the verification, and when the processing circuit fails to start normally or when the daemons exhibit abnormal operation after the processing circuit starts, the first control circuit displaying an error message on the display device.

In some embodiments, a circuit verification method for a server system. The server system comprises a management circuit and a processing circuit. The processing circuit is coupled to the management circuit. The management circuit comprises a first control circuit, a second control circuit, and a first memory. The first control circuit comprises a storage unit and firmware. The second control circuit is coupled to the first control circuit. The processing circuit comprises a second memory and a power control circuit. The second memory is coupled to the first control circuit. The power control circuit is coupled to the second control circuit. The circuit verification method comprises: the first control circuit checking whether the processing circuit identification information stored in the second memory has been stored in the first list or the second list stored in the storage unit; and when the processing circuit identification information has been stored in the first list, the first control circuit providing a first signal to the second control circuit, the second control circuit providing a startup signal to the power control circuit based on the first signal, and the power control circuit controlling a power source to supply power to the processing circuit based on the startup signal to start the processing circuit.

In some embodiments, the circuit verification method further comprises: when the processing circuit identification information has been stored in the second list, the first control circuit providing a second signal to the second control circuit, the second control circuit providing a startup rejection signal to the power control circuit based on the second signal, and the power control circuit controlling the power supply not to supply power to the processing circuit based on the startup rejection signal to prevent the processing circuit from starting.

In some embodiments, the circuit verification method further comprises: when the processing circuit identification information has not been stored in the first list or the second list, the first control circuit comparing the first verification value stored in the first memory and the second verification value stored in the second memory to verify the processing circuit.

In some embodiments, the server system further comprises a display device. The circuit verification method further comprises: when the processing circuit identification information has been stored in the second list, the first control circuit displaying an error message on the display device.

The following will describe the detailed features and advantages of the instant disclosure in detail in the detailed description. The content of the description is sufficient for any person skilled in the art to comprehend the technical context of the instant disclosure and to implement it accordingly. According to the content, claims and drawings disclosed in the instant specification, any person skilled in the art can readily understand the goals and advantages of the instant disclosure.

BRIEF DESCRIPTION OF THE DRAWINGS

The disclosure will become more fully understood from the detailed description given herein below for illustration only, and thus not limitative of the disclosure, wherein.

DETAILED DESCRIPTION

Figure 1:
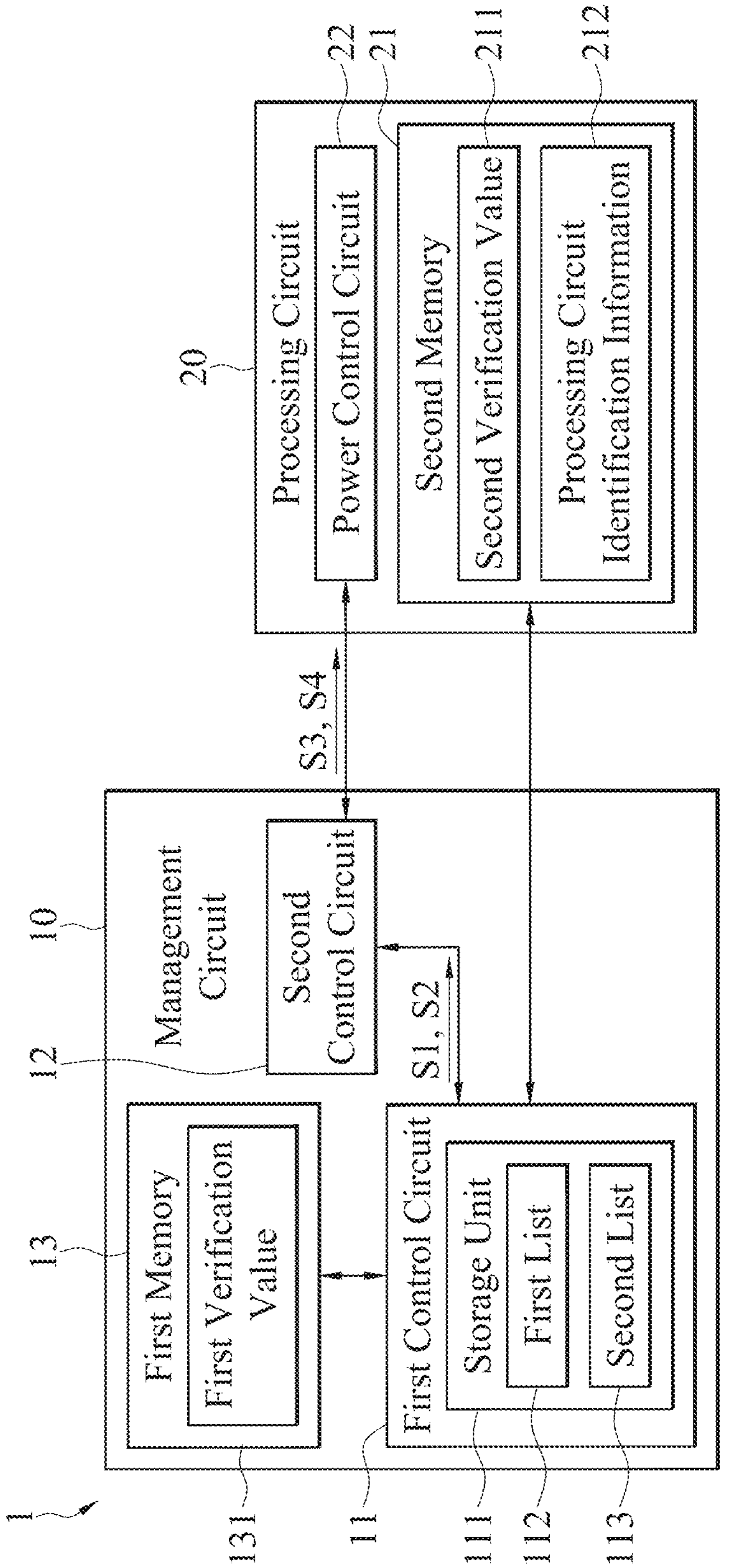
FIG. 1 illustrates a block schematic diagram of an embodiment of a server system.

Please refer to FIG. 1. A server system 1 comprises a management circuit 10 and a processing circuit 20. The management circuit 10 comprises a first control circuit 11, a second control circuit 12, and a first memory 13. The first control circuit 11 comprises a storage unit 111 and firmware. The storage unit 111 is configured to store a first list 112 and a second list 113. The firmware comprises a plurality of daemons. The second control circuit 12 and the first memory 13 are coupled to the first control circuit 11. The first memory 13 is configured to store a first verification value 131. The processing circuit 20 is coupled to the management circuit 10 and comprises a second memory 21 and a power control circuit 22. The second memory 21 is coupled to the first control circuit 11 and is configured to store a second verification value 211 and processing circuit identification information 212. The power control circuit 22 is coupled to the second control circuit 12 and a power supply (not shown in FIGs).

In some embodiments, the management circuit 10 may be but not limited to a DC-SCM module (Data Center-ready Secure Control Module). In some embodiments, the processing circuit 20 may be but not limited to a Host Processor Module (HPM). In some embodiments, the management circuit 10 and the processing circuit 20 are disposed on different circuit boards, but the present invention is not limited thereto. In some embodiments, the management circuit 10 and the processing circuit 20 are disposed on the same circuit board. In some embodiments, the processing circuit 20 is connected to the management circuit 10 in a pluggable manner. In some embodiments, the first control circuit 11 may be but not limited to a Baseboard Management Controller (BMC). In some embodiments, the second control circuit 12 may be but not limited to a Complex Programmable Logic Device (CPLD). In some embodiments, the second control circuit 12 is connected to the second memory 21 via an inter-integrated circuit bus ($I^2C$ Bus), but the present invention is not limited thereto. In some embodiments, the first memory 13 and the second memory 21 are Electrically Erasable Programmable Read-Only Memory (EEPROM), but the present invention is not limited thereto. In some embodiments, the first memory 13 and the second memory 21 may be any non-volatile storage medium, such as Read-Only Memory (ROM), Programmable ROM (PROM), Erasable Programmable ROM (EPROM), EEPROM, One-Time Programmable ROM (OTPROM), or Flash Memory, wherein the types of the first memory 13 and second memory 21 are not limited herein. In some embodiments, the first memory 13 and second memory 21 may be but not limited to Field Replaceable Unit (FRU). In some embodiments, the storage unit 111 may be any non-volatile storage medium, such as ROM, PROM, EPROM, EEPROM, OTPROM, or Flash Memory, wherein the type of the storage unit 111 is not limited herein.

Figure 2:
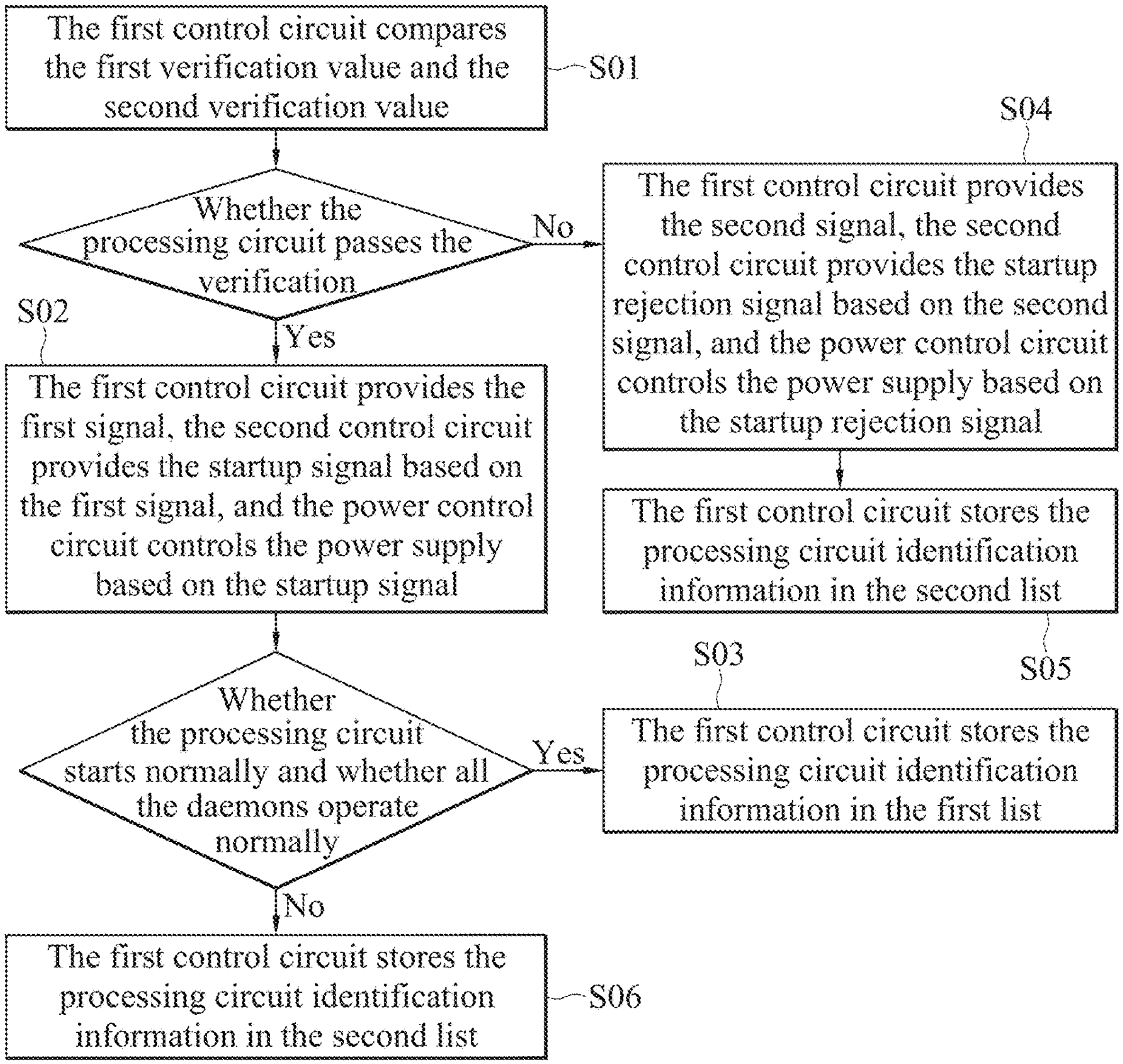
FIG. 2 illustrates a flowchart of an embodiment of a circuit verification method.

Please refer to FIG. 1 and FIG. 2. In some embodiments, the first control circuit 11 is configured to compare the first verification value 131 and the second verification value 211 to verify the processing circuit 20 (step S01). When the processing circuit 20 passes verification, the first control circuit 11 provides a first signal S1 to the second control circuit 12. The second control circuit 12 provides a startup signal S3 to the power control circuit 22 based on the first signal S1. The power control circuit 22 controls the power supply to supply power to the processing circuit 20 based on the startup signal S3 to start the processing circuit 20. (step S02). When the processing circuit 20 starts normally and all the daemons operate normally after the processing circuit 20 starts, the first control circuit 11 stores the processing circuit identification information 212 in the first list 112 (step S03).

In some embodiments, before step S01, the management circuit 10 is further configured to detect the connection status between the processing circuit 20 and the management circuit 10. When the management circuit 10 detects that the connection status is "connected", the management circuit 10 then triggers the first control circuit 11 to compare the first verification value 131 and the second verification value 211 to verify the processing circuit 20 (i.e., step S01). In some embodiments, when the management circuit 10 detects that the connection status is "disconnected", the management circuit 10 does not trigger the first control circuit 11 to perform step S01. In some embodiments, the management circuit 10 detects the connection status between the processing circuit 20 and the management circuit 10 via a detection pin, but the present invention is not limited thereto.

In some embodiments, the first verification value 131 is the Product ID and SKU ID of the management circuit 10, and the second verification value 211 is the Product ID and SKU ID of the processing circuit 20, but the present invention is not limited thereto. In some embodiments, the processing circuit identification information 212 is the address information of the processing circuit 20, such as the Media Access Control (MAC) address of the processing circuit 20, but the present invention is not limited thereto. In some embodiments, in step S03, when the processing circuit 20 starts normally and all the daemons operate normally after the processing circuit 20 starts, the first control circuit 11 stores the second verification value 211 in the first list 112. In some embodiments, the power supply is disposed in the processing circuit 20, but the present invention is not limited thereto. In some embodiments, the power supply is disposed in the management circuit 10 or any location other than the management circuit 10 and the processing circuit 20, wherein the location of the power supply is not limited herein.

In some embodiments, when the processing circuit 20 fails the verification, the first control circuit 11 provides a second signal S2 to the second control circuit 12. The second control circuit 12 provides a startup rejection start signal S4 to the power control circuit 22 based on the second signal S2. The power control circuit 22 controls the power supply not to supply power to the processing circuit 20 based on the startup rejection start signal S4 to prevent the processing circuit 20 from starting (step S04). When the processing circuit 20 fails the verification, the first control circuit 11 stores the processing circuit identification information 212 in the second list 113 (step S05). In some embodiments, in step S05, when the processing circuit 20 fails the verification, the first control circuit 11 stores the second verification value 211 in the second list 113.

In some embodiments, the first control circuit 11 is connected to the second control circuit 12 via a serial general-purpose input/output (SGPIO) or $I^2C$ Bus. That is, the first control circuit 11 sends the first signal S1 or the second signal S2 to the second control circuit 12 via SGPIO or $I^2C$ Bus, but the present invention is not limited thereto. In some embodiments, the second control circuit 12 is connected to the power control circuit 22 via a Data Center Secure Control Interface (DC-SCI). That is, the second control circuit 12 sends the startup signal S3 or the startup rejection start signal S4 to the power control circuit 22 via DC-SCI, but the present invention is not limited thereto.

In some embodiments, when the processing circuit 20 fails to start normally or when the daemons exhibit abnormal operation after the processing circuit 20 starts, the first control circuit 11 stores the processing circuit identification information 212 in the second list 113 (step S06). In some embodiments, in step S06, when the processing circuit 20 fails to start normally or when the daemons exhibit abnormal operation after the processing circuit 20 starts, the first control circuit 11 stores the second verification value 211 in the second list 113.

In some embodiments, the first control circuit 11 executes the circuit verification method through a plurality of daemons, but the present invention is not limited thereto.

In summary, the first control circuit 11 can verify the compatibility between the management circuit 10 and the processing circuit 20 by comparing the first verification value 131 and the second verification value 211. When the processing circuit 20 passes the verification, the first control circuit 11 supplies power to the processing circuit 20 to enable the processing circuit 20 to start. Therefore, by executing the circuit verification method, the server system 1 can avoid hardware and software issues caused by incompatibility between the management circuit 10 and the processing circuit 20 after the processing circuit 20 starts.

Figure 3:
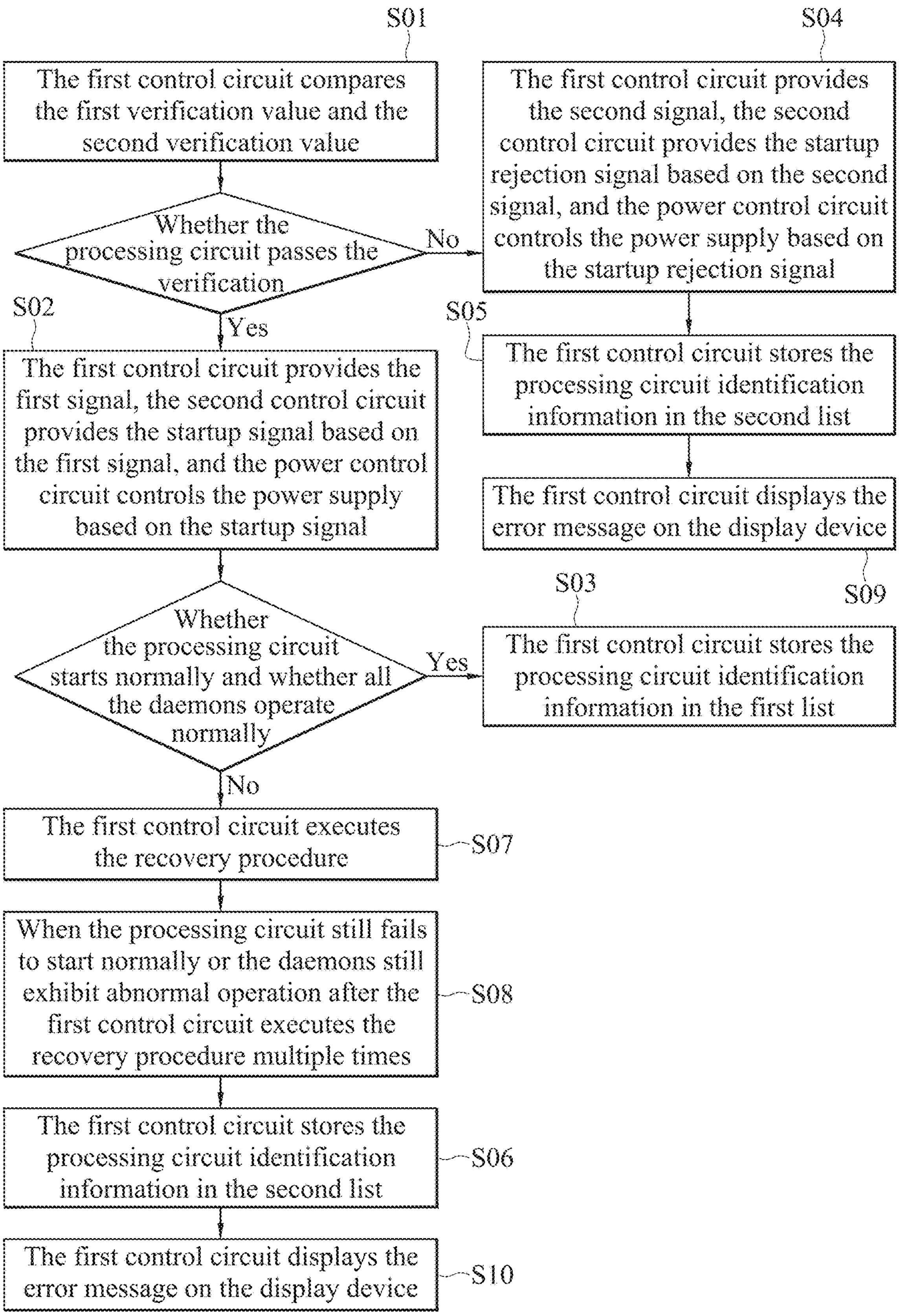
FIG. 3 illustrates a flowchart of another embodiment of the circuit verification method.

Please refer to FIG. 1 and FIG. 3. In some embodiments, when the processing circuit 20 fails to start normally or the daemons exhibit abnormal operation after the processing circuit 20 starts, the first control circuit 11 executes a recovery procedure (step S07). When the processing circuit 20 still fails to start normally or the daemons still exhibit abnormal operation after the first control circuit 11 executes the recovery procedure multiple times (step S08), the first control circuit 11 stores the processing circuit identification information into the second list 113 (step S06).

In some embodiments, the server system 1 further comprises a display device (not shown in FIGs). In some embodiments, when the processing circuit 20 fails the verification, the first control circuit 11 displays an error message on the display device (step S09). In some embodiments, when the processing circuit 20 fails to start normally or when the daemons exhibit abnormal operation after the processing circuit 20 starts, the first control circuit 11 also displays the error message on the display device (step S10).

Figure 4A:
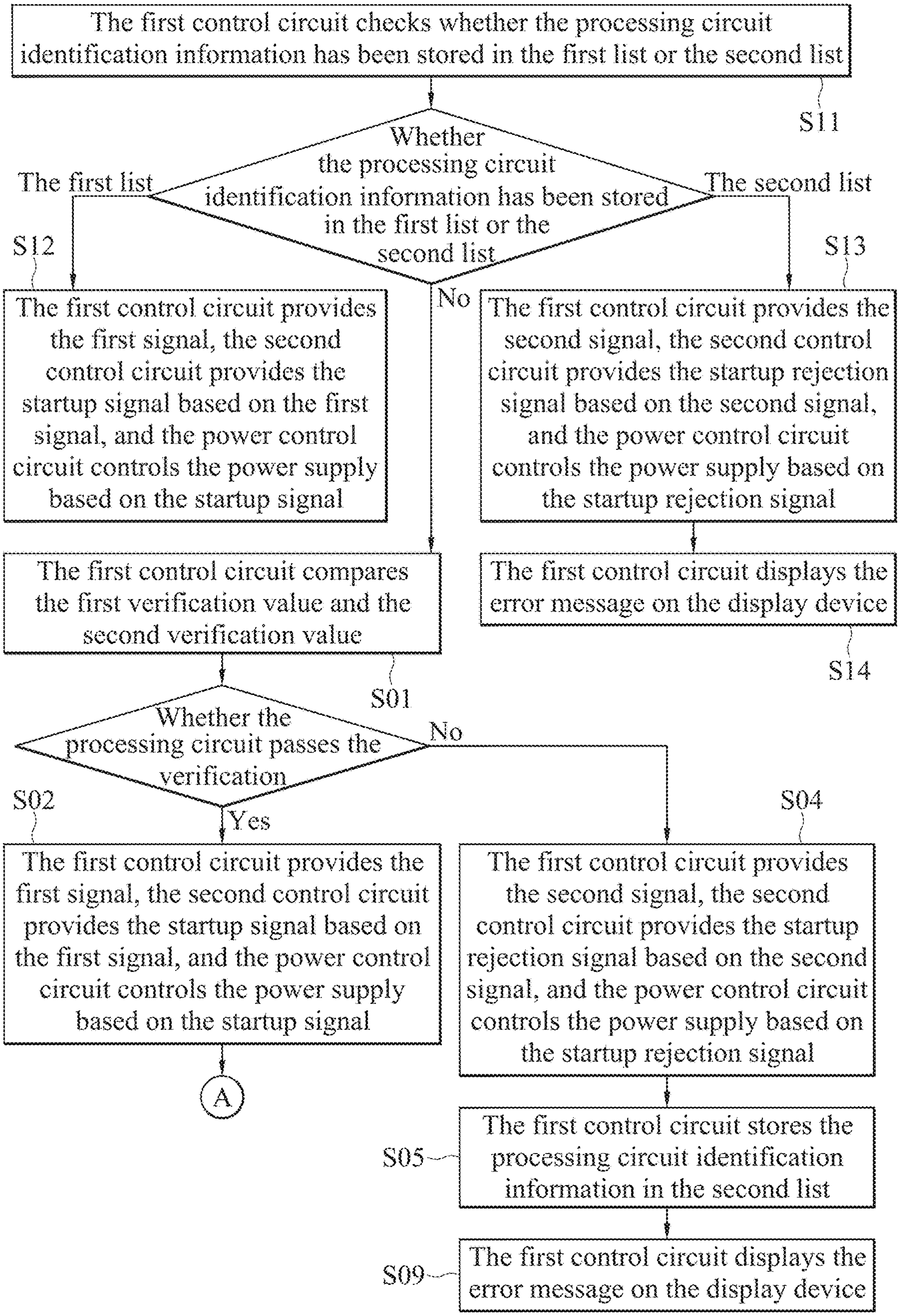
FIG. 4A and FIG. 4B illustrate a flowchart of yet another embodiment of the circuit verification method.
Figure 4B:
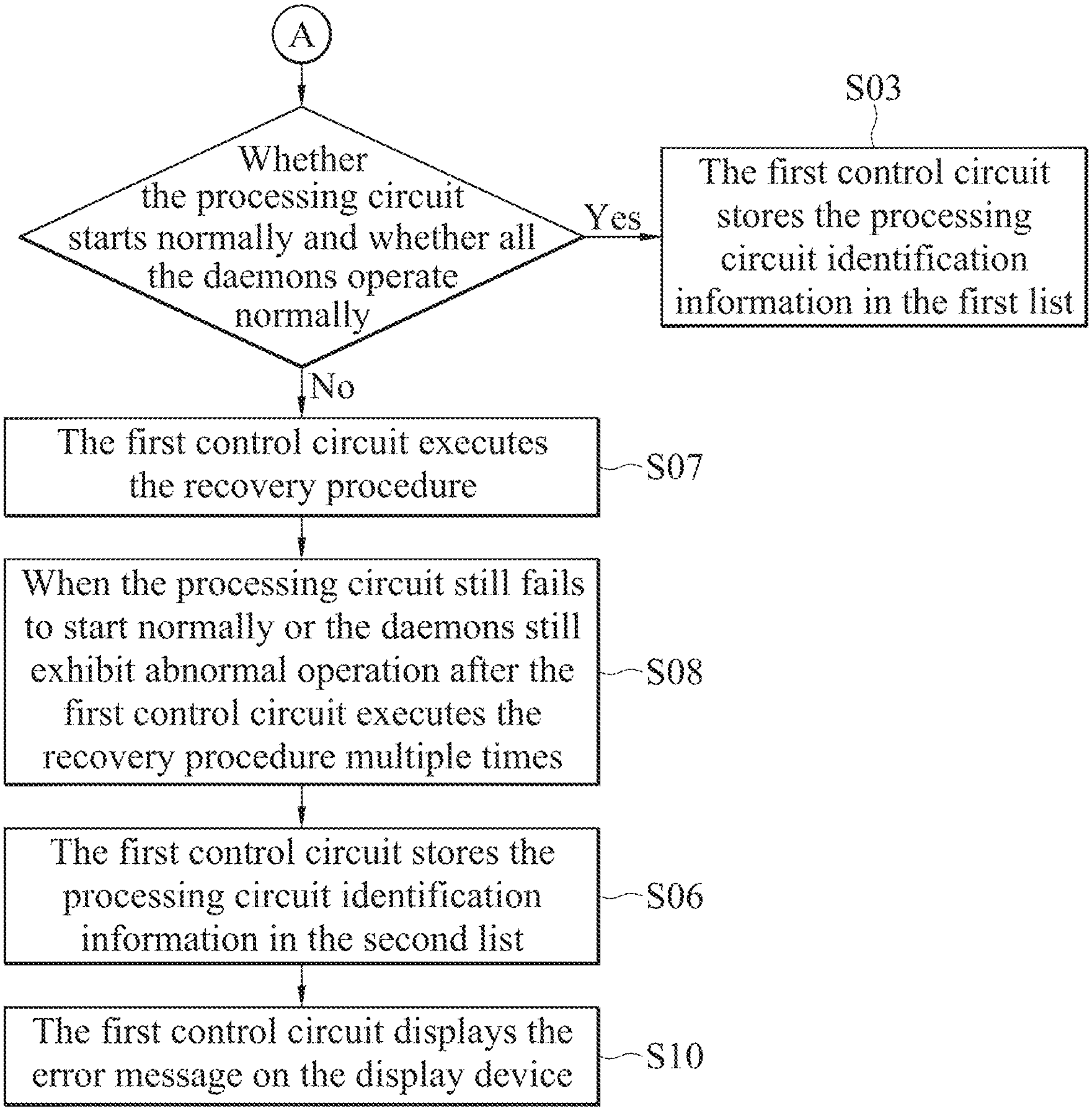

Please refer to FIG. 1, FIG. 4A and FIG. 4B. In some embodiments, before the first control circuit 11 compares the first verification value 131 and the second verification value 211 to verify the processing circuit 20, the first control circuit 11 checks whether the processing circuit identification information 212 has been stored in the first list 112 or the second list 113 (step S11). When the processing circuit identification information 212 has been stored in the first list 112, the first control circuit 11 provides the first signal S1 to the second control circuit 12. The second control circuit 12 provides the startup signal S3 to the power control circuit 22 based on the first signal S1. The power control circuit 22 controls the power supply to supply power to the processing circuit 20 based on the startup signal S3 to start the processing circuit 20 (step S12).

In some embodiments, before step S11, the management circuit 10 is further configured to detect the connection status between the processing circuit 20 and the management circuit 10. When the management circuit 10 detects that the connection status is "connected", the management circuit 10 then triggers the first control circuit 11 to check whether the processing circuit identification information 212 has been stored in the first list 112 or the second list 113 (i.e., step S11). In some embodiments, when the management circuit 10 detects that the connection status is "disconnected", the management circuit 10 does not trigger the first control circuit 11 to perform step S11.

In some embodiments, when the processing circuit identification information 212 has been stored in the second list 113, the first control circuit 11 provides the second signal S2 to the second control circuit 12. The second control circuit 12 provides the startup rejection signal S4 to the power control circuit 22 based on the second signal S2. The power control circuit 22 controls the power supply not to supply power to the processing circuit 20 based on the startup rejection signal S4 to prevent the processing circuit 20 from starting (step S13).

In some embodiments, only when the processing circuit identification information 212 has not been stored in either the first list 112 or the second list 113, the first control circuit 11 executes the circuit verification method shown in FIG. 2 or the circuit verification method shown in FIG. 3, that is, verifying the compatibility between the management circuit 10 and the processing circuit 20 by comparing the first verification value 131 and the second verification value 211.

Through step S11 and step S12, for a processing circuit 20 whose processing circuit identification information 212 has already been stored in the first list 112, the first control circuit 11 does not need to re-execute the circuit verification method shown in FIG. 2 or FIG. 3, and can directly supply power to this processing circuit 20. In other words, for a processing circuit 20 that has already passed the compatibility verification with the management circuit 10 through comparison of the first verification value 131 and the second verification value 211, during subsequent boot-ups, the first control circuit 11 can directly supply power to start this processing circuit 20, thereby accelerating the boot verification time of this processing circuit 20.

Similarly, through step S11 and step S13, for a processing circuit 20 whose processing circuit identification information 212 has been stored in the second list 113, the first control circuit 11 does not need to re-execute the circuit verification method shown in FIG. 2 or FIG. 3, and can directly not supply power to this processing circuit 20. In other words, for a processing circuit 20 that has not passed the compatibility verification with the management circuit 10 through comparison of the first verification value 131 and the second verification value 211, during subsequent boot-ups, the first control circuit 11 can directly not supply power to prevent this processing circuit 20 from starting, thereby accelerating the boot verification time of this processing circuit 20.

In some embodiments, if, in step S03, the first control circuit 11 stores the second verification value 211 in the first list 112, and in steps S05 and S06, the first control circuit 11 stores the second verification value 211 in the second list 113, then in step S11, the first control circuit 11 checks whether the second verification value 211 has been stored in the first list 112 or the second list 113.

In some embodiments, when the processing circuit identification information 212 has been stored in the second list 113, the first control circuit 11 displays the error message on the display device (step S14).

To sum up, in some embodiments, the server system 1 can execute the circuit verification method to avoid software and hardware issues caused by incompatibility between the management circuit 10 and the processing circuit 20 after the processing circuit 20 is powered on. Moreover, the server system 1 can execute steps S11 to S13 to accelerate the boot verification time of the processing circuit 20 during subsequent boot-ups.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A server system, comprising:

a management circuit, comprising:

a first control circuit comprising a storage unit and firmware, wherein the storage unit is configured to store a first list, and the firmware comprises a plurality of daemons;

a second control circuit coupled to the first control circuit; and a first memory coupled to the first control circuit, wherein the first memory is configured to store a first verification value; and a processing circuit coupled to the management circuit, comprising:

a second memory coupled to the first control circuit, wherein the second memory is configured to store a second verification value and processing circuit identification information; and a power control circuit coupled to the second control circuit and a power supply;

wherein the first control circuit is configured to compare the first verification value and the second verification value to verify the processing circuit, when the processing circuit passes verification, the first control circuit provides a first signal to the second control circuit, the second control circuit provides a startup signal to the power control circuit based on the first signal, the power control circuit controls the power supply to supply power to the processing circuit based on the startup signal to start the processing circuit, and when the processing circuit starts normally and all the daemons operate normally after the processing circuit starts, the first control circuit stores the processing circuit identification information in the first list, and wherein the storage unit is further configured to store a second list, when the processing circuit fails the verification, the first control circuit provides a second signal to the second control circuit, the second control circuit provides a startup rejection signal to the power control circuit based on the second signal, the power control circuit controls the power supply not to supply power to the processing circuit based on the startup rejection signal to prevent the processing circuit from starting, and when the processing circuit fails the verification, the first control circuit stores the processing circuit identification information in the second list.

2. The server system according to claim 1, wherein when the processing circuit fails to start normally or when the daemons exhibit abnormal operation after the processing circuit starts, the first control circuit stores the processing circuit identification information in the second list.

3. The server system according to claim 1, wherein before comparing the first verification value and the second verification value to verify the processing circuit, the first control circuit further checks whether the processing circuit identification information has been stored in the first list or the second list, when the processing circuit identification information has been stored in the first list, the first control circuit provides the first signal to the second control circuit, the second control circuit provides the startup signal to the power control circuit based on the first signal, and the power control circuit controls the power supply to supply power to the processing circuit based on the startup signal to start the processing circuit.

4. The server system according to claim 1, wherein when the processing circuit identification information has been stored in the second list, the first control circuit provides the second signal to the second control circuit, the second control circuit provides the startup rejection signal to the power control circuit based on the second signal, and the power control circuit controls the power supply not to supply power to the processing circuit based on the startup rejection signal to prevent the processing circuit from starting.

5. The server system according to claim 1, wherein when the processing circuit identification information has not been stored in the first list or the second list, the first control circuit compares the first verification value and the second verification value to verify the processing circuit.

6. The server system according to claim 1, wherein when the processing circuit fails to start normally or the daemons exhibit abnormal operation after the processing circuit starts, the first control circuit executes a recovery procedure, and when the processing circuit still fails to start normally or the daemons still exhibit abnormal operation after the first control circuit executes the recovery procedure multiple times, the first control circuit stores the processing circuit identification information in the second list.

7. The server system according to claim 1, further comprising a display device, wherein when the processing circuit fails the verification, when the processing circuit fails to start normally or when the daemons exhibit abnormal operation after the processing circuit starts, and when the processing circuit identification information has been stored in the second list, the first control circuit displays an error message on the display device.

8. A circuit verification method for a server system, wherein the server system comprises a management circuit and a processing circuit, the processing circuit is coupled to the management circuit, the management circuit comprises a first control circuit, a second control circuit, and a first memory, the first control circuit comprises a storage unit and firmware, the second control circuit is coupled to the first control circuit, the processing circuit comprises a second memory and a power control circuit, the second memory is coupled to the first control circuit, the power control circuit is coupled to the second control circuit, and the circuit verification method comprises:

the first control circuit comparing a first verification value stored in the first memory and a second verification value stored in the second memory to verify the processing circuit;

when the processing circuit passes verification, the first control circuit providing a first signal to the second control circuit, the second control circuit providing a startup signal to the power control circuit based on the first signal, and the power control circuit controlling a power supply to supply power to the processing circuit based on the startup signal to start the processing circuit; and when the processing circuit starts normally and a plurality of daemons comprised in the firmware operate normally after the processing circuit starts, the first control circuit storing processing circuit identification information stored in the second memory in a first list stored in the storage unit, wherein the storage unit is further configured to store a second list, and the circuit verification method further comprises:

when the processing circuit fails the verification, the first control circuit providing a second signal to the second control circuit, the second control circuit providing a startup rejection signal to the power control circuit based on the second signal, and the power control circuit controlling the power supply not to supply power to the processing circuit based on the startup rejection signal to prevent the processing circuit from starting; and when the processing circuit fails the verification, the first control circuit storing the processing circuit identification information in the second list.

9. The circuit verification method according to claim 8, further comprising:

when the processing circuit fails to start normally or when the daemons exhibit abnormal operation after the processing circuit starts, the first control circuit storing the processing circuit identification information in the second list.

10. The circuit verification method according to claim 8, further comprising:

when the processing circuit fails to start normally or when the daemons exhibit abnormal operation after the processing circuit starts, the first control circuit executing a recovery procedure; and when the processing circuit still fails to start normally or the daemons still exhibit abnormal operation after the first control circuit executes the recovery procedure multiple times, the first control circuit storing the processing circuit identification information in the second list.

11. The circuit verification method according to claim 8, wherein the server system further comprises a display device, and the circuit verification method further comprises:

when the processing circuit fails the verification, and when the processing circuit fails to start normally or when the daemons exhibit abnormal operation after the processing circuit starts, the first control circuit displaying an error message on the display device.

12. A circuit verification method for a server system, wherein the server system comprises a management circuit and a processing circuit, the processing circuit is coupled to the management circuit, the management circuit comprises a first control circuit, a second control circuit, and a first memory, the first control circuit comprises a storage unit and firmware, the second control circuit is coupled to the first control circuit, the processing circuit comprises a second memory and a power control circuit, the second memory is coupled to the first control circuit, the power control circuit is coupled to the second control circuit, and the circuit verification method comprises:

the first control circuit checking whether processing circuit identification information stored in the second memory has been stored in a first list or a second list stored in the storage unit;

when the processing circuit identification information has been stored in the first list, the first control circuit providing a first signal to the second control circuit, the second control circuit providing a startup signal to the power control circuit based on the first signal, and the power control circuit controlling a power source to supply power to the processing circuit based on the startup signal to start the processing circuit; and when the processing circuit identification information has been stored in the second list, the first control circuit providing a second signal to the second control circuit, the second control circuit providing a startup rejection signal to the power control circuit based on the second signal, and the power control circuit controlling a power supply not to supply power to the processing circuit based on the startup rejection signal to prevent the processing circuit from starting.

13. The circuit verification method according to claim 12, further comprising:

when the processing circuit identification information has not been stored in the first list or the second list, the first control circuit comparing a first verification value stored in the first memory and a second verification value stored in the second memory to verify the processing circuit;

when the processing circuit passes verification, the first control circuit providing the first signal to the second control circuit, the second control circuit providing the startup signal to the power control circuit based on the first signal, and the power control circuit controlling the power supply to supply power to the processing circuit to start the processing circuit; and when the processing circuit starts normally and a plurality of daemons comprised in the firmware operate normally after the processing circuit starts, the first control circuit storing the processing circuit identification information in the first list.

14. The circuit verification method according to claim 12, further comprising:

when the processing circuit fails a verification, the first control circuit providing the second signal to the second control circuit, the second control circuit providing a startup rejection signal to the power control circuit based on the second signal, and the power control circuit controlling the power supply not to supply power to the processing circuit based on the startup rejection signal to prevent the processing circuit from starting; and when the processing circuit fails the verification, the first control circuit storing the processing circuit identification information in the second list.

15. The circuit verification method according to claim 13, further comprising:

when the processing circuit fails to start normally or when the daemons exhibit abnormal operation after the processing circuit starts, the first control circuit storing the processing circuit identification information in the second list.

16. The circuit verification method according to claim 13, further comprising:

when the processing circuit fails to start normally or when the daemons exhibit abnormal operation after the processing circuit starts, the first control circuit executing a recovery procedure; and when the processing circuit still fails to start normally or the daemons still exhibit abnormal operation after the first control circuit executes the recovery procedure multiple times, the first control circuit storing the processing circuit identification information in the second list.

17. The circuit verification method according to claim 13, wherein the server system further comprises a display device, and the circuit verification method further comprises:

when the processing circuit fails the verification, when the processing circuit fails to start normally or when the daemons exhibit abnormal operation after the processing circuit starts, and when the processing circuit identification information has been stored in the second list, the first control circuit displaying an error message on the display device.

* * * * *